United States Patent
Park et al.

(10) Patent No.: US 8,194,416 B2
(45) Date of Patent: Jun. 5, 2012

(54) MULTILAYER PRINTED CIRCUIT BOARD HAVING ELECTROMAGNETIC WAVE REDUCTION MEMBER

(75) Inventors: Hark Byeong Park, Suwon-si (KR); Byong Su Seol, Yongin-si (KR); Hyung Geun Kim, Yongin-si (KR); Hyun Ho Park, Daedeok-gu (KR); Jong Sung Lee, Seoul (KR); Hyung Seok Lee, Suwon-si (KR); Young Jun Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1012 days.

(21) Appl. No.: 11/970,051

(22) Filed: Jan. 7, 2008

(65) Prior Publication Data
US 2008/0198567 A1     Aug. 21, 2008

(30) Foreign Application Priority Data
Feb. 16, 2007   (KR) .................. 10-2007-0016854

(51) Int. Cl.
*H05K 9/00*     (2006.01)
(52) U.S. Cl. ...................................... 361/818
(58) Field of Classification Search .......... 361/818, 361/780, 793, 794; 174/255
See application file for complete search history.

(56) References Cited

U.S. PATENT DOCUMENTS

| | | | |
|---|---|---|---|
| 5,981,869 A | 11/1999 | Kroger | |
| 6,617,509 B1 | 9/2003 | Bergstedt et al. | |
| 6,686,808 B1 | 2/2004 | Sugawara et al. | |
| 6,870,436 B2 | 3/2005 | Grebenkemper | |
| 7,519,328 B2 * | 4/2009 | Dokai et al. | 455/41.2 |
| 2002/0015293 A1 * | 2/2002 | Akiba et al. | 361/793 |
| 2002/0105083 A1 | 8/2002 | Sun et al. | |
| 2007/0236518 A1 * | 10/2007 | Oto et al. | 345/691 |

FOREIGN PATENT DOCUMENTS

| | | |
|---|---|---|
| JP | 62-128597 | 6/1987 |
| JP | 7-10979 | 2/1995 |
| JP | 10-190237 | 7/1998 |
| KR | 2006-93519 | 8/2006 |
| WO | 03/041463 | 5/2003 |

OTHER PUBLICATIONS

European Search Report issued Sep. 16, 2009 in EP Application No. 08100555.5.
Japanese Office Action issued May 25, 2010 in JP Application No. 2008-023642.

* cited by examiner

*Primary Examiner* — Jeremy Norris
*Assistant Examiner* — Tremesha S Willis
(74) *Attorney, Agent, or Firm* — Stanzione & Kim, LLP

(57) ABSTRACT

Disclosed is a multilayer printed circuit board. The multilayer printed circuit board includes a power source surface to provide power to each component disposed on the power source surface, a ground surface having a reference voltage, a strip line which passes through the power source surface and/or the ground surface so as to transmit signals between components, an antenna installed in proximity to a sectional region of the power source surface and the ground surface, and an electromagnetic wave reduction member which is provided between the power source surface and the ground surface to effectively reduce an electromagnetic wave generated from the strip line.

17 Claims, 5 Drawing Sheets

MULTILAYER PRINTED CIRCUIT BOARD HAVING ELECTROMAGNETIC WAVE REDUCTION MEMBER

CROSS-REFERENCE TO RELATED APPLICATIONS

This application claims the benefit of Korean Patent Application No. 2007-16854 filed on Feb. 16, 2007, in the Korean Intellectual Property Office, the disclosure of which is incorporated herein by reference in its entirety.

BACKGROUND OF THE INVENTION

1. Field of the Invention

The present general inventive concept relates to a multilayer printed circuit board, and more particularly to a multilayer printed circuit board capable of reducing an electromagnetic wave radiated within a sectional region of the multilayer printed circuit board.

2. Description of the Related Art

In general, a multilayer printed circuit board refers to a printed circuit board including a plurality of layers. As disclosed in Korean Unexamined Patent Publication No. 2006-93519 (electromagnetic wave shielding structure in multilayer printed circuit board), a conventional multilayer printed circuit board includes a top surface of a first layer and a bottom surface of a fourth layer on which various components constituting an electronic circuit and a plurality of patterns for connecting the components to each other are formed, a power source surface of a third layer which is divided into a 1.5V surface, a 3.3 V surface and a 5V surface so as to provide DC power for operating the components, and a ground surface of a second layer having a reference voltage. In addition, although it is not disclosed in detail in Korean Unexamined Patent Publication No. 2006-93519, the conventional multilayer printed circuit board includes a strip line which is provided between the power source surface and the ground surface so as to connect the components to each other.

In such a conventional multilayer printed circuit board, as current flows through the strip line, signals are transferred between the components. However, when current flows through the strip line, an electromagnetic wave is generated according to Maxwell's equations. In addition, the electromagnetic wave is transmitted to a sectional surface of the multilayer printed circuit board by means of the power source surface and the ground surface serving as transmission paths for the wave.

However, in such a conventional multilayer printed circuit board, the electromagnetic wave generated from the strip line is propagated so that the electromagnetic wave is radiated around a sectional region of the multilayer printed circuit board. If the multilayer printed circuit board is used for a broadcasting receiver, a broadcasting receive antenna is installed around the sectional region of the multilayer printed circuit board. In this case, a receive sensitivity of the broadcasting receive antenna is degraded due to interference from the electromagnetic wave that radiates around the sectional region of the multilayer printed circuit board.

That is, in the broadcasting receiver, the broadcasting receive antenna is generally placed around the sectional region of the multilayer printed circuit board due to the structure of the product, and in this case, the electromagnetic wave radiated around the sectional region of the multilayer printed circuit board causes interference, thereby lowering a signal-to-noise ratio of the broadcasting receive antenna.

SUMMARY OF THE INVENTION

The present general inventive concept provides a multilayer printed circuit board capable of reducing an electromagnetic wave radiated around a sectional region of the multilayer printed circuit board.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a multilayer printed circuit board including a power source surface to provide power to a plurality of electrical components, a ground surface having a reference voltage, a strip line formed to pass through the power source surface and/or the ground surface to transmit signals between at least two of the plurality of electrical components, an antenna disposed in proximity to a sectional region of the power source surface and the ground surface, and an electromagnetic wave reduction member which is provided between the power source surface and the ground surface in proximity to the antenna to reduce the electromagnetic wave generated from the strip line.

The electromagnetic wave reduction member may include a capacitor and a resistor.

The capacitor and the resistor may be arranged in series, and an interplane ground surface may be disposed between the capacitor and the resistor.

The interplane ground surface may be formed to bend toward the power source surface or the ground surface.

The interplane ground surface may be formed to have a corrugated shape.

The electromagnetic wave reduction member may be formed of a high dielectric material and a resistor.

The foregoing and/or other aspects and utilities of the present general inventive concept may also be achieved by providing a multilayer printed circuit board including a power source surface to provide power to a plurality of components, a ground surface having a reference voltage, a strip line formed to pass through the power source surface and/or the ground surface to transmit signals between at least two of the plurality of components, and a capacitor and a resistor formed between the power source surface and the ground surface to reduce the scatter parameter of an electromagnetic wave generated from the strip line.

A high dielectric material may be provided instead of the capacitor.

The foregoing and/or other aspects and utilities of the present general inventive concept may also be achieved by providing a multilayer printed circuit board including a power source surface having electrical components disposed thereon, a ground surface having a reference voltage, a scatter pattern reduction unit disposed between the power source surface and the ground surface; a strip line formed to pass through at least the power source surface and to transmit electrical signals between the electrical components, and an antenna disposed in proximity to the strip line and the scatter pattern effect reduction unit.

The scatter pattern effect reduction unit may be an embedded impedance element.

The scatter pattern effect reduction unit may be an embedded impedance element formed of a high dielectric material.

An interference effect on the antenna caused by an electromagnetic wave generated around the strip line may be effectively reduced.

An interference effect may be measured by an S parameter.

The foregoing and/or other aspects and utilities of the present general inventive concept may also be achieved by providing a multilayer printed circuit board including a power source surface, a ground surface having a reference voltage, a strip line formed to pass through the power source surface and the ground surface, and an electromagnetic wave reduction member disposed in proximity to the strip line and between the power source surface and the ground surface.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
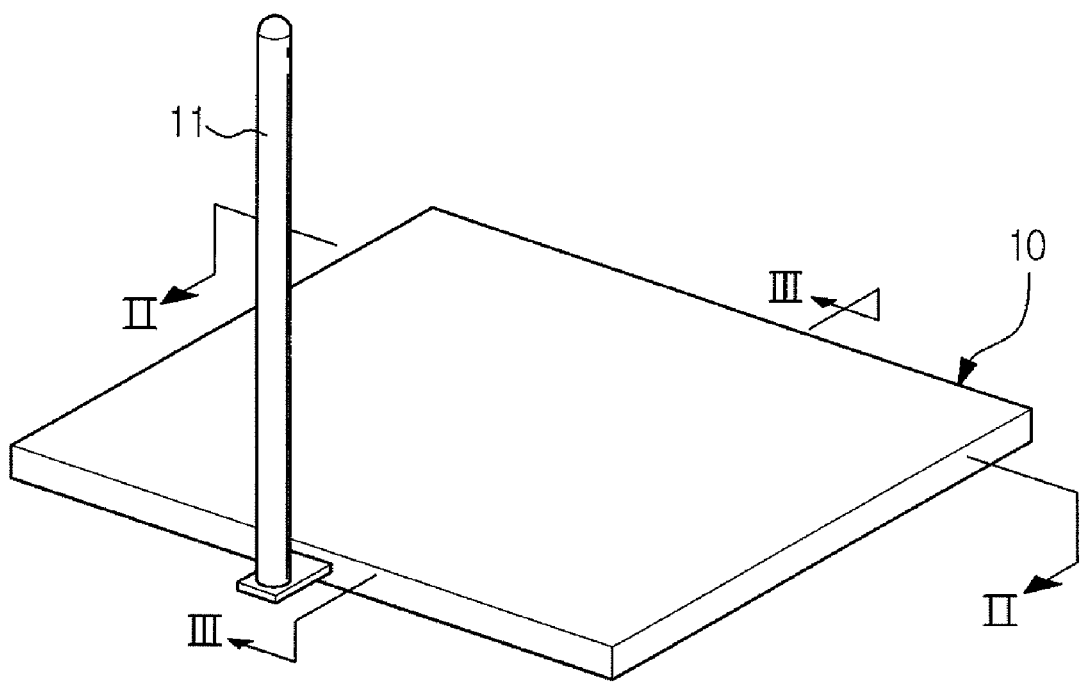
FIG. 1 is a perspective view illustrating a multilayer printed circuit board according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
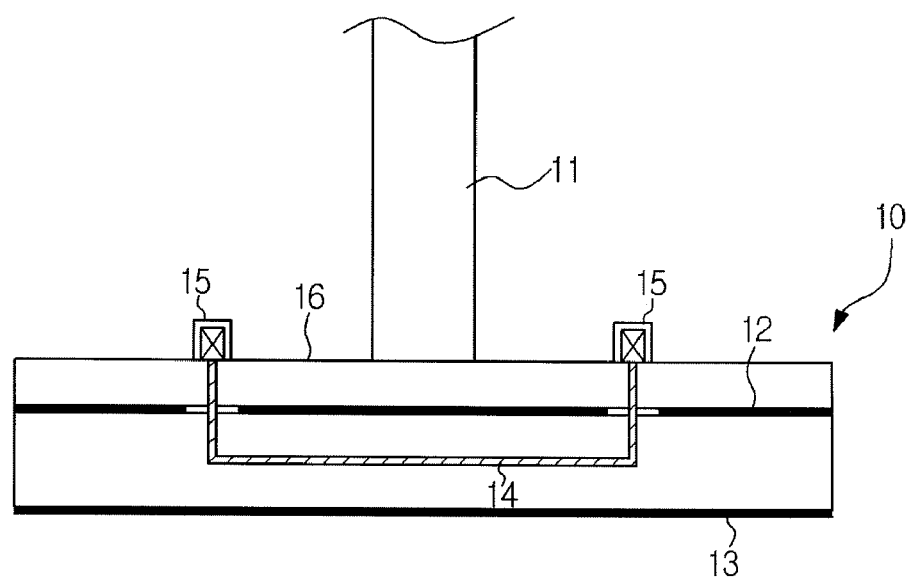
FIG. 2 is a sectional view of the multilayer printed circuit board taken along line II-II illustrated in FIG. 1.
Figure 3:
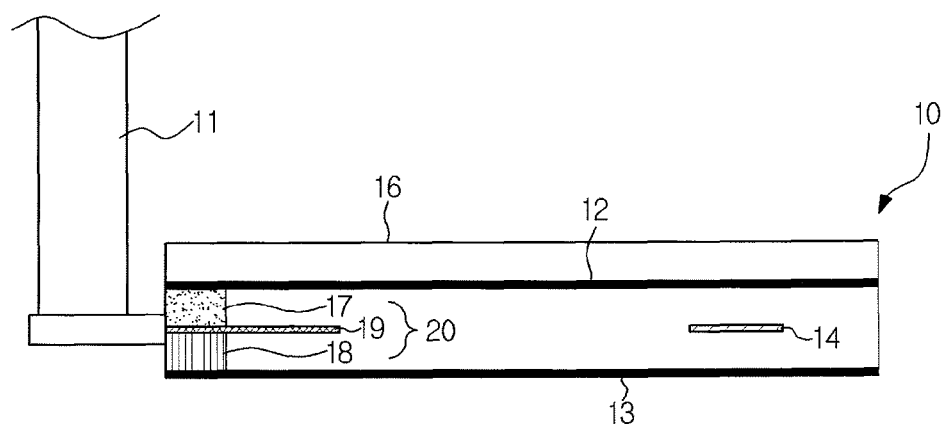
FIG. 3 is a sectional view of the multilayer printed circuit board taken along line III-III illustrated in FIG. 1.

As illustrated in FIGS. 1 to 3, a multilayer printed circuit board 10 according to an embodiment of the present general inventive concept includes a mounting surface 16 on which various components 15 are mounted, a power source surface 12 to provide power to the components 15, and a ground surface 13 having a reference voltage.

In addition, the multilayer printed circuit board 10 according to the present general inventive concept further includes a broadcasting receive antenna 11 which is installed adjacent to the sectional region of the multilayer printed circuit board 10 so as to receive broadcasting signals, and a strip line 14 which passes through the power source surface 12 and/or the ground surface 13 so as to transmit signals between the components.

Further, an electromagnetic wave reduction member 20 (refer to FIG. 3) is installed between the power source surface 12 and the ground surface 13 so as to reduce an electromagnetic wave which is generated from the strip line 14 and is transmitted toward a broadcasting receive antenna. The electromagnetic wave reduction member 20 includes an embedded capacitor 17, an embedded resistor 18, and an interplane ground surface 19 installed between the capacitor 17 and the resistor 18.

One terminal of the capacitor 17 is connected to the power source surface 12, and the other terminal of the capacitor 17 is connected to the interplane ground surface 19. In addition, one terminal of the resistor 18 is connected to the ground surface 13 and the other terminal of the resistor 18 is connected to the interplane ground surface 19. For reference, the position of the capacitor 17 and the resistor 18 can be interchanged. That is, the resistor 18 can be provided in the above-described location of the capacitor 17, and the capacitor 17 can be provided in the above-described location of the resistor 18. In other words, the placement of capacitor 17 and resistor 18 can be reversed.

Because the capacitor 17 and the resistor 18 are formed to reduce an electromagnetic wave being generated around the broadcasting receive antenna 11, the capacitor 17 and the resistor 18 are, in an embodiment, formed between the power source surface 12 and the ground surface 13 of the multilayer printed circuit board 10 and in proximity to the broadcasting receive antenna 11.

In this embodiment, when the capacitor 17 is formed between the power source surface 12 and the ground surface 13, an impedance between the power source surface 12 and the ground surface 13 decreases from an impedance for a high frequency state, because the impedance caused by the capacitor 17 is inversely proportional to the frequency of the electromagnetic wave being propagated. Thus, as the frequency of the electromagnetic wave increases, the impedance caused by the capacitor 17 decreases. Such a reduction of the impedance weakens an electric field strength around the sectional region of the multilayer printed circuit 10 having the capacitor 17, so that the electromagnetic wave, which is generated from the strip line 14 and interferes with the broadcasting receive antenna, is reduced.

If the capacitor 17 is embedded, resonance may occur due to parasitic inductance between the power source surface 12 and the ground surface 13. In this embodiment, the resistor 18 serves as a damper to attenuate the resonance.

In an embodiment of the general inventive concept, the interplane ground surface 19 is a copper sheet that serves to connect between the capacitor 17 and the resistor 18 and to reduce the electromagnetic wave being generated from the strip line 14. In order to reinforce the function of the strip line 14, the interplane ground surface 19 (more precisely, a sectional region of the interplane ground surface 19) can be formed to bend toward the power source surface 12 or toward the ground surface 13. In another embodiment, the interplane ground surface 19 having a corrugated shape can be formed between the capacitor 17 and the resistor 18. In this embodiment, a shield effect is increased, thereby reducing the electromagnetic wave being generated and transmitted into the sectional region of the multilayer printed circuit board 10 in proximity to broadcasting receive antenna 11.

In a further embodiment, the capacitor 17 described above can be replaced with a high dielectric material. That is, the high dielectric material having a large capacitance can be provided in place of the capacitor 17 illustrated in FIG. 3, such that the high dielectric material may serve as the capacitor 17.

Hereinafter, an operation of the multilayer printed circuit 10 according to an embodiment of the present general inventive concept will be described.

When a current flows through the strip line 14 to transmit signals between components 15, an electromagnetic wave is generated around the strip line 14. The electromagnetic wave is propagated through the power source surface 12 and the ground surface 13, including toward the sectional region of the multilayer printed circuit 10, without a significant loss of field strength.

When the electromagnetic wave reaches the sectional region of the multilayer printed circuit board 10 in proximity to broadcast receive antenna 11, the electromagnetic wave being radiated around the sectional region of the capacitor 17 is reduced due to the impedance reduction effect caused by the capacitor 17, as explained above. As a result, the interference effect of the electromagnetic wave relative to broadcast receive antenna 11 is reduced.

Figure 4A:
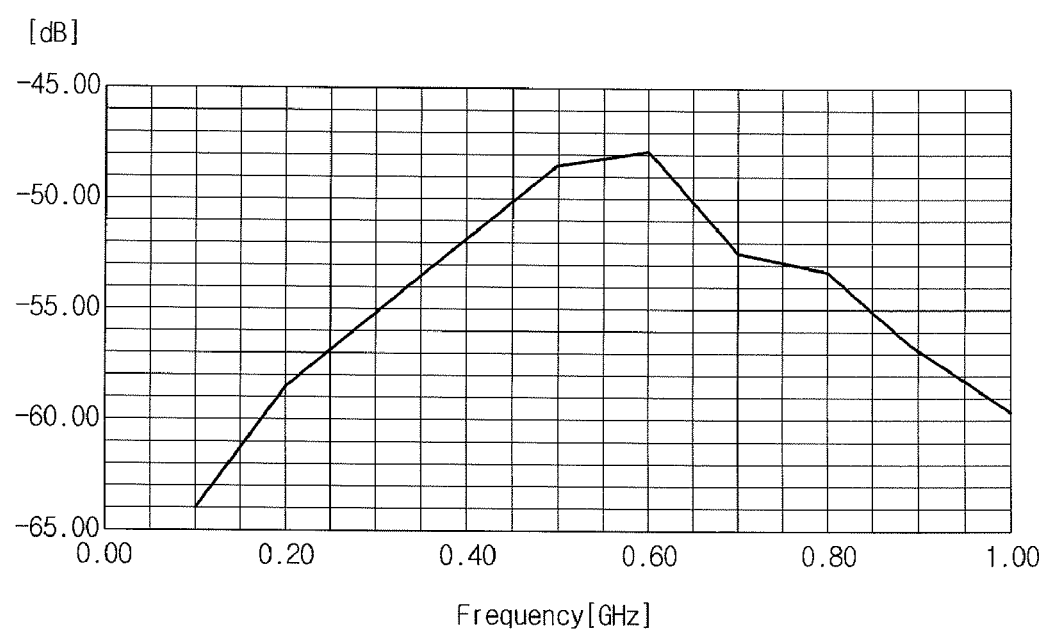
FIG. 4A is a graph illustrating an electromagnetic wave reduction effect in a conventional multilayer printed circuit board.
Figure 4B:
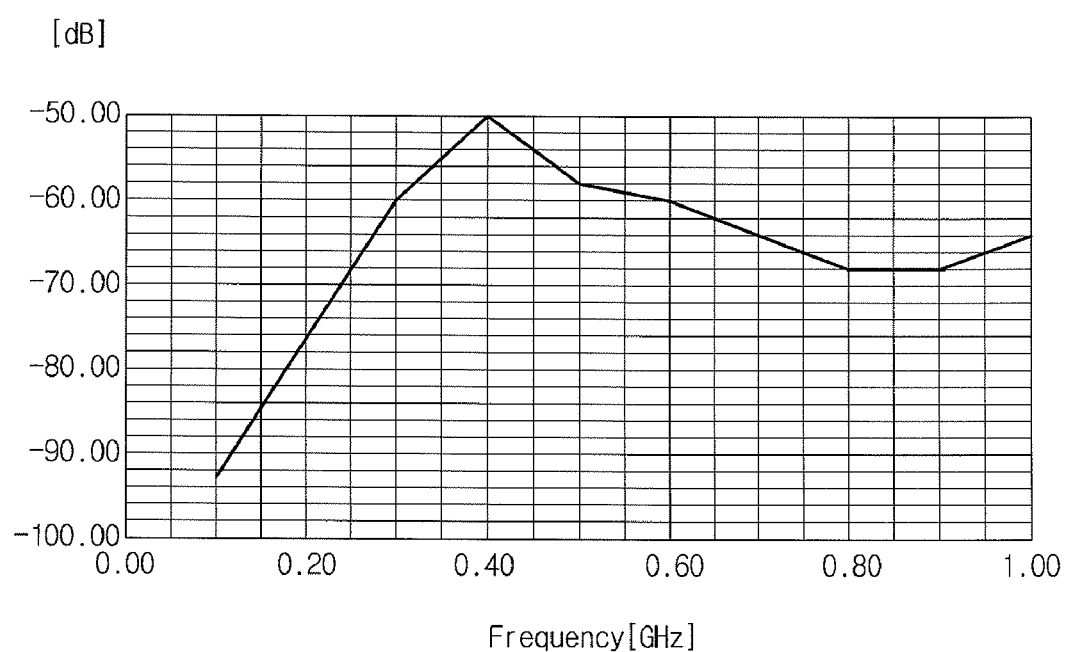
FIG. 4B is a graph illustrating an electromagnetic wave reduction effect in a multilayer printed circuit board according to an embodiment of the present general inventive concept.

In this embodiment, the interference effect refers to an extent of an influence exerted upon the broadcasting receive antenna 11 by the electromagnetic wave generated by strip line 14. FIGS. 4A and 4B graphically illustrate the numerical analysis result for a scatter parameter (i.e., an "S parameter") of the interference effect. An S parameter input value is a unit voltage value which is input into the strip line 14, and an S parameter output value is a voltage value of the broadcasting receive antenna 11. In addition, an X-axis and a Y-axis as illustrated in FIGS. 4A and 4B represent frequency (in GHz) and decibels (in dB), respectively.

FIG. 4A represents the S parameter in a conventional multilayer printed circuit board according to the related art, and FIG. 4B represents the S parameter in the multilayer printed circuit board 10 according to the present general inventive concept. It can be understood from FIGS. 4A and 4B that the S parameter value of the multilayer printed circuit board 10 of the present general inventive concept is reduced by about 7 dB as compared with the relatively smaller reduction of the S parameter value of a conventional multilayer printed circuit board of the related art. In particular, the S parameter value according to the present general inventive concept is significantly reduced by about 20 dB within a frequency band of 200 MHz for DBM as compared with the S parameter value according to the related art. This means that the multilayer printed circuit board 10 according to the present general inventive concept can effectively reduce the interference effect exerted upon the broadcasting receive antenna 11 by the strip line 14.

In an embodiment, the broadcasting receive antenna 11 is utilized as an example of an antenna affected by the generated electromagnetic wave, however, the present general inventive concept can be applied to a multilayer printed circuit board having other types of antennas, such as an antenna for mobile communication which is formed adjacent to the sectional region of the multilayer printed circuit board.

As described above in detail, the multilayer printed circuit board according to the present general inventive concept can effectively reduce the influence of the electromagnetic waves which are generated from the strip line 14 and radiated within the sectional region of the multilayer printed circuit board 10.

In particular, the electromagnetic wave generated around the broadcasting receive antenna 11 can be effectively reduced even if the broadcasting receive antenna 11 is formed to be in, or in proximity to, the sectional region of the multilayer printed circuit board 10, thereby effectively preventing receive sensitivity of the broadcasting receive antenna 11 from being degraded.

Although a few embodiments of the present general inventive concept have been illustrate and described, it will be appreciated by those skilled in the art that changes may be made in these embodiments without departing from the principles and spirit of the general inventive concept, the scope of which is defined in the appended claims and their equivalents.

What is claimed is:

1. A multilayer printed circuit board, comprising:
a power source surface to provide power to a plurality of electrical components;
a ground surface having a reference voltage;
a strip line formed to pass completely through the power source surface and/or the ground surface to transmit signals between at least two of the plurality of electrical components;
an antenna disposed in proximity to a sectional region of the power source surface and the ground surface; and
an electromagnetic wave reduction member separate from the power source surface provided between the power source surface and the ground surface in proximity to the antenna to reduce an electromagnetic wave generated from the strip line,
wherein the electromagnetic wave reduction member includes a capacitor and a resistor arranged in series, and an interplane ground surface disposed between the capacitor and the resistor, the interplane ground surface serving to connect between the capacitor and the resistor to reduce the electromagnetic wave being generated from the strip line.

2. The multilayer printed circuit board of claim 1, wherein the interplane ground surface is formed to bend toward the power source surface or the ground surface.

3. The multilayer printed circuit board of claim 1, wherein the interplane ground surface is formed to have a corrugated shape.

4. The multilayer printed circuit board of claim 1, wherein the electromagnetic wave reduction member is formed of a high dielectric material and a resistor.

5. A multilayer printed circuit board, comprising:
a power source surface to provide power to a plurality of components;
a ground surface having a reference voltage;
a strip line formed to pass through the power source surface and/or the ground surface to transmit signals between at least two of the plurality of components; and
a capacitor and a resistor separate from the power source surface formed between the power source surface and the ground surface to reduce the scatter parameter effect of an electromagnetic wave generated from the strip line,
wherein an interplane ground surface is disposed between the capacitor and the resistor, the capacitor and the resistor separate from the power source surface are arranged in series, and the interplane ground surface serves to connect between the capacitor and the resistor to reduce the electromagnetic wave being generated from the strip line.

6. The multilayer printed circuit board of claim 5, wherein the interplane ground surface is formed to bend toward the power source surface or the ground surface.

7. The multilayer printed circuit board of claim 5, wherein the interplane ground surface is formed to have a corrugated shape.

8. The multilayer printed circuit board of claim 5, wherein a high dielectric material is provided instead of the capacitor.

9. A multilayer printed circuit board, comprising:
a power source surface having electrical components disposed thereon;
a ground surface having a reference voltage;
a scatter pattern effect reduction unit separate from the power source surface disposed between the power source surface and the ground surface;
a strip line formed to pass through at least the power source surface and to transmit electrical signals between the electrical components; and an antenna disposed in proximity to the strip line and the scatter pattern effect reduction unit,
wherein the scatter pattern effect reduction unit includes a capacitor and a resistor, and an interplane ground surface is disposed between the capacitor and the resistor, the capacitor and the resistor are arranged in series, and the interplane ground surface serves to connect between the capacitor and the resistor to reduce the electromagnetic wave being generated from the strip line.

10. The multilayer printed circuit board of claim 9, wherein the scatter pattern effect reduction unit includes an embedded impedance element.

11. The multilayer printed circuit board of claim 9, wherein the scatter pattern effect reduction unit includes an embedded impedance element formed of a high dielectric material.

12. The multilayer printed circuit board of claim 9, wherein an interference effect on the antenna caused by an electromagnetic wave generated around the strip line is effectively reduced.

13. The multilayer printed circuit board of claim 12, wherein the interference effect is measured by a scatter parameter ("S parameter").

14. The multilayer printed circuit board of claim 13, wherein the S parameter includes an input value having a unit voltage value which is input into the strip line and an output value having a voltage value of the antenna.

15. A multilayer printed circuit board, comprising:
a power source surface;
a ground surface having a reference voltage;
a strip line formed to pass through the power source surface and the ground surface; and
an electromagnetic wave reduction member separate from the power source surface disposed between the power source surface and the ground surface and in proximity to the strip line,
wherein the electromagnetic wave reduction member includes a capacitor and a resistor, and an interplane ground surface is disposed between the capacitor and the resistor, the capacitor and the resistor are arranged in series, and the interplane ground surface serves to connect between the capacitor and the resistor to reduce the electromagnetic wave being generated from the strip line.

16. The multilayer printed circuit board of claim 15, wherein the electromagnetic wave reduction member operates to effectively reduce an interference effect caused by an electromagnetic wave generated around the strip line.

17. The multilayer printed circuit board of claim 16, wherein the interference effect is measured by an S parameter.

* * * * *